United States Patent [19]
Huang et al.

[11] Patent Number: 6,058,059
[45] Date of Patent: May 2, 2000

[54] SENSE/OUTPUT CIRCUIT FOR A SEMICONDUCTOR MEMORY DEVICE

[75] Inventors: Shih-Huang Huang; Hsin-Pang Lu, both of Hsinchu, Taiwan

[73] Assignees: United Microelectronics Corp.; United Silicon Incorporated, both of Hsinchu, Taiwan

[21] Appl. No.: 09/385,737

[22] Filed: Aug. 30, 1999

[51] Int. Cl.$^7$ ...................................................... G11C 7/02
[52] U.S. Cl. .................... 365/207; 365/189.05; 365/194; 365/208
[58] Field of Search .................................. 365/207, 194, 365/189.05, 205, 208

[56] References Cited

U.S. PATENT DOCUMENTS 5,959,910  9/1999  McClure ............................ 365/208 X
5,959,919  9/1999  Choi .................................. 365/207

Primary Examiner—Huan Hoang
Attorney, Agent, or Firm—Thomas, Kayden, Horstemeyer & Risley

[57] ABSTRACT

A sense/output circuit is designed for use with a memory device, such as an SDRAM (Synchronized Dynamic Random-Access Memory) device, which is capable of switching off some power-consuming circuit components immediately after the requested data output is completed. This feature can help reduce the power consumption by the overall memory system, making the use of the SDRAM device more cost-effective. Moreover, the reduction of power consumption can be achieved without concerning process parameters, component parameters, and temperature variations. As a result, the delay margin can be reduced compared to the prior art, which also contribute to the reduction of power consumption.

12 Claims, 4 Drawing Sheets

SENSE/OUTPUT CIRCUIT FOR A SEMICONDUCTOR MEMORY DEVICE

BACKGROUND OF THE INVENTION

Field of the Invention

This invention relates to integrated circuit memory technology, and more particularly, to a sense/output circuit which is designed for use with a memory device, such as an SDRAM (Synchronized Dynamic Random-Access Memory) device, which is capable of switching off some power-consuming circuit components immediately after the requested data output is completed.

Description of the Related Art

SDRAM is a new type of dynamic random access memory (DRAM) that can run at higher clock speeds than conventional DRAMs. Fundamentally, an SDRAM device is coupled with a sense amplifier which is connected to the output bit lines for amplifying the differential data signals representative of data on the bit lines to a detectable level so that the data can be sensed by the external circuitry connected to the SDRAM device.

During each read cycle, the sense amplifier is activated and remains activated until the requested data have been output to the external circuitry. After this, the memory controller switches off the sense amplifier and inactivates the word lines. One drawback to this practice, however, is that it consumes a great deal of power since the sense amplifier and the word lines are powered on all the time during the read cycle and are disabled only after the requested data output is completed.

One solution to the foregoing problem is to switch off the sense amplifier after a preset delay after the sense amplifier is switched on. One drawback to this solution, however, is that the delay is a fixed value independent of the requested data output; and therefore, a suitable delay margin should be added so as to ensure that the power-off is carried out after the requested data output is completed. This delay margin is dependent on various factors, including process parameters, component parameters, and temperature variations. For this reason, the delay margin is usually set to a large value in order to ensure that the sense amplifier will be switched off only after the requested data output is completed. A large delay margin, however, is highly power consumptive and destabilizes the operation of the SDRAM device.

Therefore, there exists a need in the IC industry for a sense/output circuit for use with SDRAM that is capable of keeping track of the data outputting operation so that some power-consuming circuit components can be switched off immediately after the requested data output is completed.

SUMMARY OF THE INVENTION

It is therefore an objective of this invention to provide a sense/output circuit for use with a memory device, which can switch off some power-consuming circuit components immediately after the requested data output is completed, so that the overall power consumption can be reduced.

In accordance with the foregoing and other objectives, the invention proposes a new sense/output circuit for use with a memory device.

The sense/output circuit of the invention includes the following structures and configurations:

(a) A sense amplifier is coupled to the complementary bit lines for amplifying the differential data signal representative of data on the complementary bit lines. The amplified signal is transferred to a pair of complementary data lines.

(b) An equalizing transistor is connected across the data lines for equalizing the data lines into an equalized voltage state. (c) A first PMOS transistor, whose source is connected to the system voltage, whose drain is connected to a first complementary data line, and whose gate is connected to a first sense amplification enable signal, is switched on by the first sense amplification enable signal during the waiting state of each read cycle to pull the first complementary data line into high-voltage logic state. (d) A second PMOS transistor, whose source is connected to the system voltage, whose drain is connected to a second complementary data line, and whose gate is connected to the first sense amplification enable signal, is switched on by the first sense amplification enable signal during waiting state of each read cycle to pull the second complementary data line to high-voltage logic state.

(e) A first NAND gate has a first input end connected to the first complementary data line and a second input end connected to a second sense amplification enable signal.

(f) A second NAND gate has a first input end connected to the second complementary data line and a second input end connected to the second sense amplification enable signal.

(g) An inverter has an input end connected to receive the second sense amplification enable signal.

(h) A first transmission gate has its input end is connected to the output end of the first NAND gate and its ON/OFF state is controlled by the second sense amplification enable signal.

(i) A second transmission gate has its input end connected to the output end of the second NAND gate and its ON/OFF state is controlled by the second sense amplification enable signal.

(j) An output buffer is coupled to the output end of the first transmission gate and the output end of the second transmission gate to buffer the output signals from the first and second transmission gates.

During each read cycle, the first and second sense amplification enable signals are both pulled up to high-voltage logic state to switch on the sense amplifier and both the first and second transmission gates. Subsequently, when the respective data signals on the complementary data lines are complementary to each other, the second sense amplification enable signal and the first sense amplification enable signal are successively switched to a low-voltage logic state, thereby switching off the sense amplifier and the first and second transmission gates.

The foregoing sense/output circuit has the following advantages over the prior art. First, the sense/output circuit is capable of switching off some power-consuming circuit components immediately after the requested data output is completed, thereby reducing power consumption. Second, the reduction of power consumption can be achieved without involving process parameters, component parameters, and temperature variations. Therefore, the delay margin can be reduced compared to the prior art, which also contributes to the reduction of power consumption.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
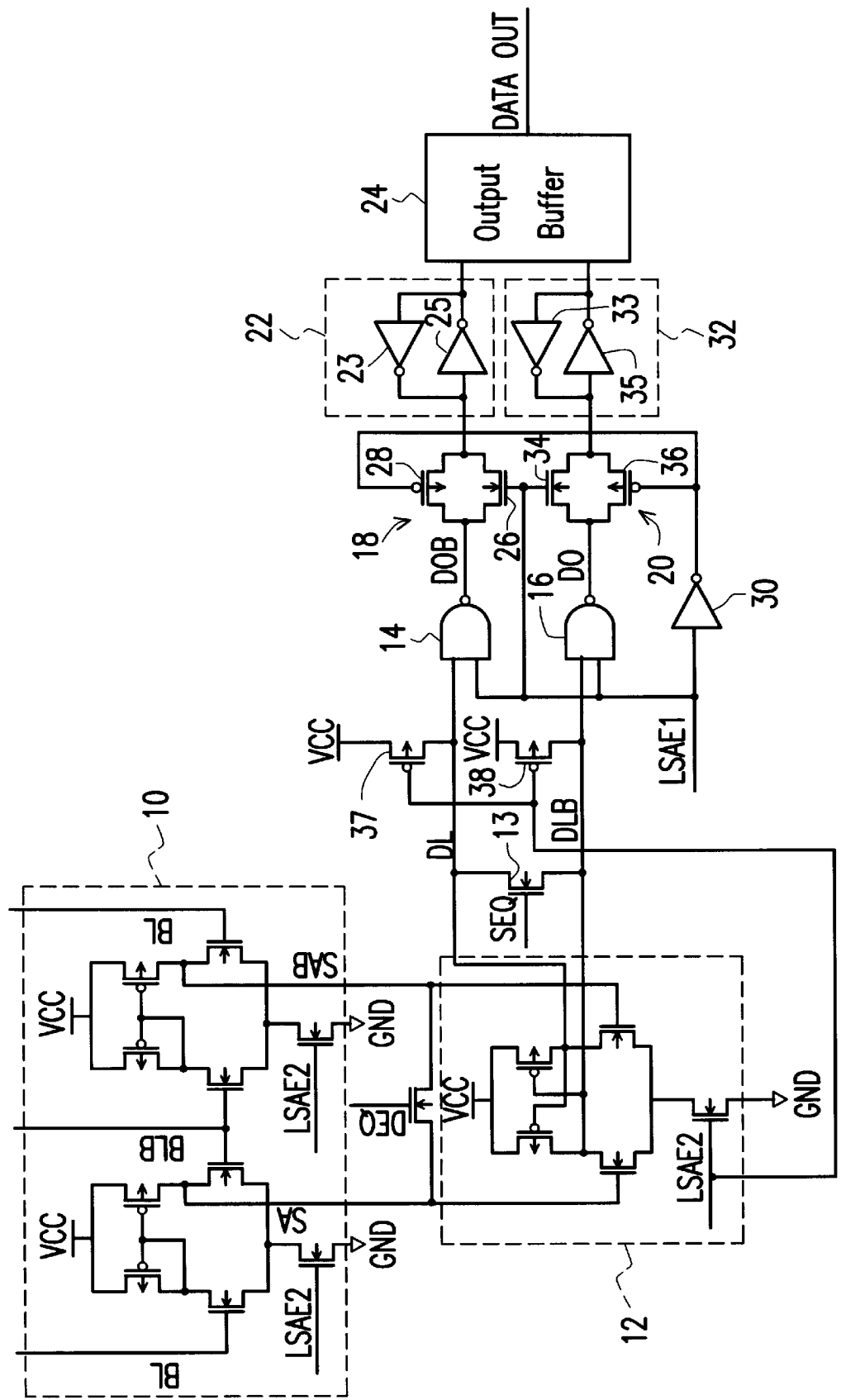
FIG. 1 is a schematic diagram showing the circuit structure of the sense/output circuit according to the invention.

FIG. 1 is a schematic diagram showing the circuit structure of the sense/output circuit according to the invention. In this example, the output signal DATA OUT represents one bit of the requested data which is output from a SDRAM device (not shown) via a pair of complementary bit lines BL and BLB.

As shown, the sense/output circuit comprises a sense amplifier having two stages of amplification circuits: a first-stage amplification circuit 10 and a second-stage amplification circuit 12. The first-stage amplification circuit 10 is coupled to a pair of output bit lines BL, BLB of the associated SDRAM device (not shown) for amplifying the differential data signal representative of a bit of data on the BL and BLB bit lines. The respective logic voltage states on the BL and BLB bit lines are complementary to each other. The amplified output signals are denoted by SA and SAB, which are also complementary to each other. The amplified output signals SA, SAB from the first-stage sense amplifier 10 are then transferred to the second-stage amplification circuit 12 for further amplification. The amplified output signals from the second-stage amplification circuit 12 are sent to a pair of data lines DL, DLB. The respective logic voltage states on the data lines DL, DLB are complementary to each. In accordance with the invention, a logic signal LSAE2 is used to control the ON/OFF states of both the first-stage amplification circuit 10 and the second-stage amplification circuit 12. An equalizing transistor 13 is connected across the two data lines DL, DLB and controlled by a logic signal SEQ for equalizing the two data lines DL, DLB into the same voltage stage.

The sense/output circuit further includes a first NAND gate 14, a second NAND gate 16, an inverter 30, a first transmission gate 18, a second transmission gate 20, a first latch 22, a second latch 32, and an output buffer 24.

The first NAND gate 14 has a first input end connected to the DL data line and a second input end connected to a logic signal LSAE1, and whose output is denoted by D0B. The second NAND gate 16 has a first input end connected to the data line DLB and a second input end connected to the logic signal LSAE1, and whose output is denoted by D0. The first transmission gate 18 is composed of an NMOS transistor 26 and a PMOS transistor 28, and has an input end connected to the output end D0B of the first NAND gate 14 and an output end connected to a first latch 22. The ON/OFF state of the first transmission gate 18 is controlled by the logic signal LSAE1, which is connected to the gate of the NMOS transistor 26 and whose inverted version (inverted by the inverter 30) is connected to the gate of the PMOS transistor 28. The output of the first transmission gate 18 is transferred to the first latch 22 to be latched therein. The second transmission gate 20 is composed of an NMOS transistor 34 and a PMOS transistor 36, and has an input end connected to the output end D0 of the second NAND gate 16. The ON/OFF state of the second transmission gate 20 is also controlled by the logic signal LSAE1 which is connected to the gate of the NMOS transistor 34 and whose inverted version (inverted by the inverter 30) is connected to the gate of the PMOS transistor 36. The output of the second transmission gate 20 is transferred to the second latch 32 to be latched therein. The first latch 22 is composed of a pair of inverters 23, 25, and has an input end connected to the output end of the first transmission gate 18 and an output end connected to the output buffer 24. The second latch 32 is also composed of a pair of inverters 33, 35, and has an input end connected to the output end of the second transmission gate 20 and an output end connected to the output buffer 24. Furthermore, a pair of PMOS transistors, including a first PMOS transistor 37 and a second PMOS transistor 38, are coupled to the data lines DL, DLB. The ON/OFF states of the PMOS transistors 37, 38 are controlled by the logic signal LSAE2. During waiting state, the logic signal LSAE2 causes both the PMOS transistors 37, 38 to be switched ON, thereby pulling up the voltage states on the data lines DL, DLB to the system voltage VCC.

Figure 2:
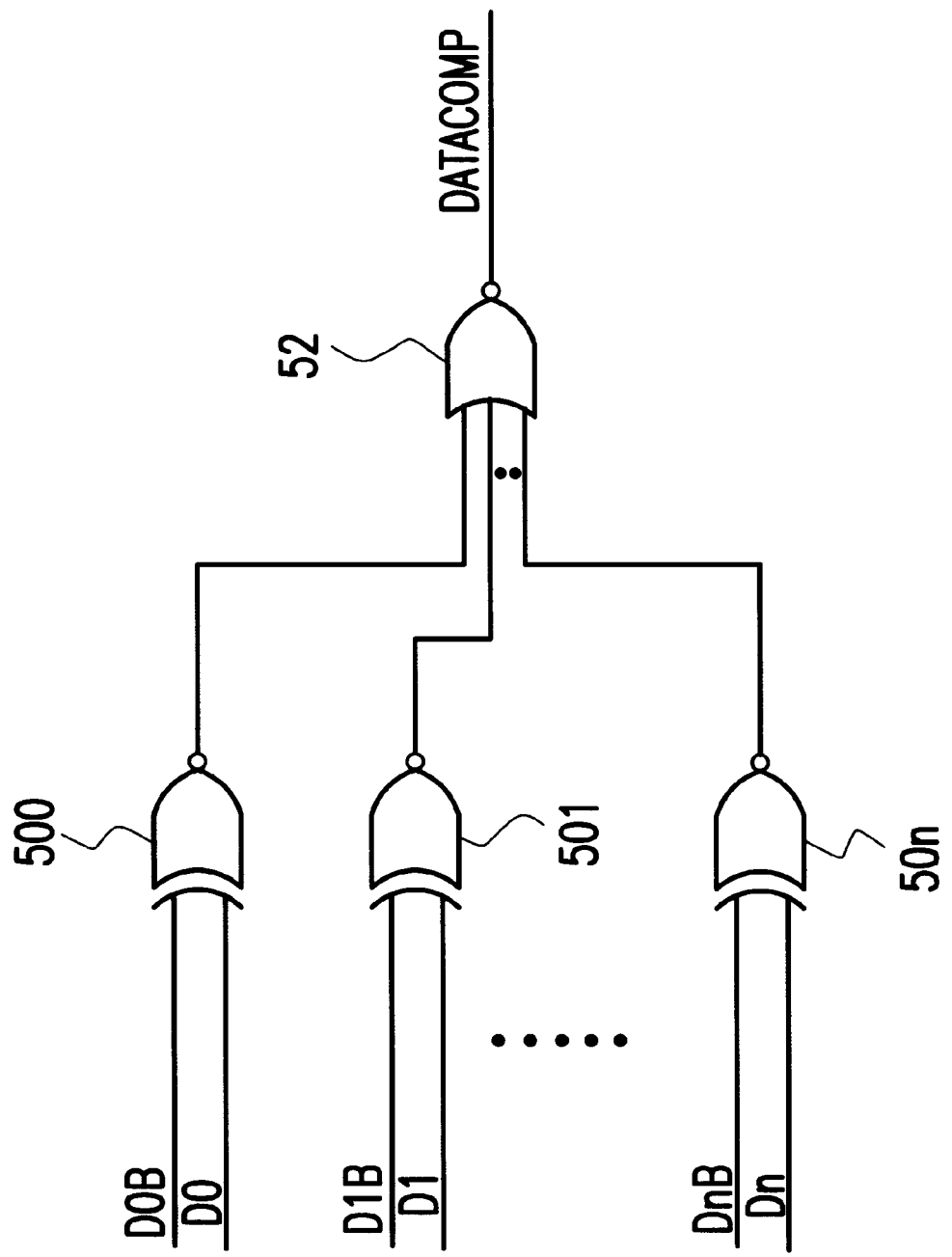
FIG. 2 is a schematic diagram of a logic circuit used to generate a data comparison signal DATACOMP.
Figure 3:
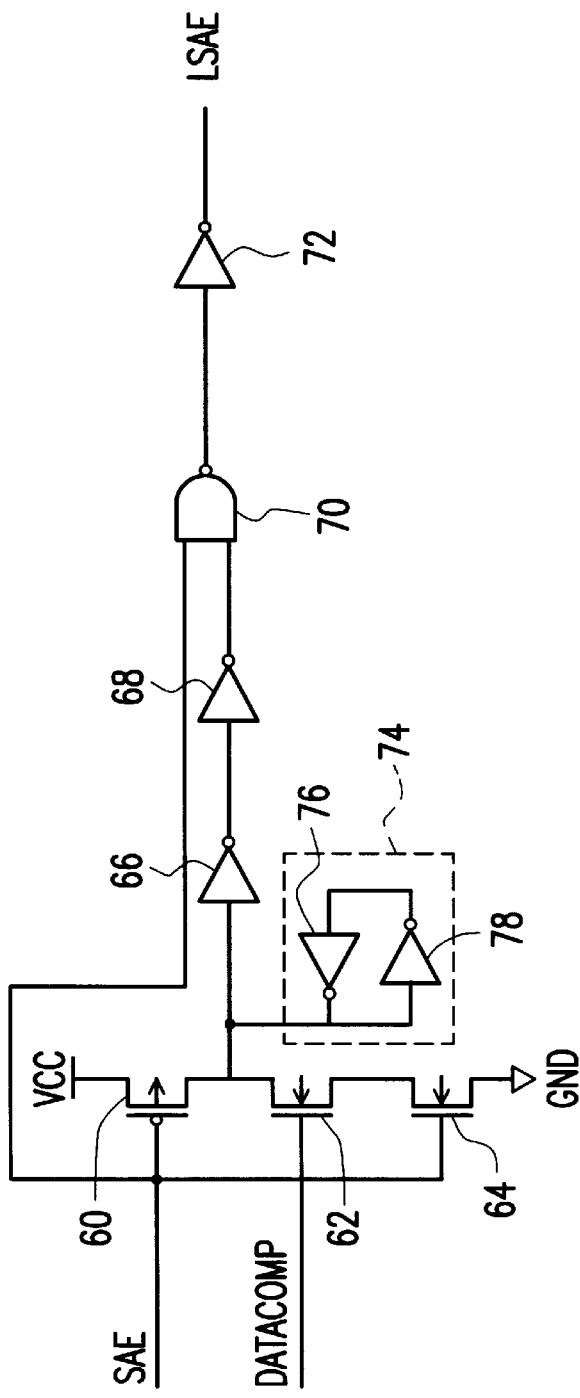
FIG. 3 is a schematic diagram of a logic circuit used to generate a logic signal LSAE.
Figure 4:
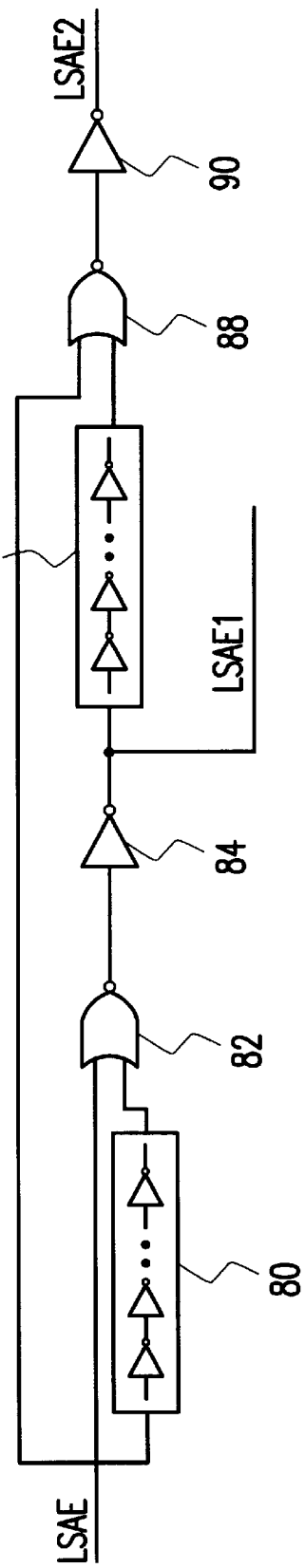
FIG. 4 is a schematic diagram a logic circuit used to generate a first sense amplification enable signal LSAE1 and a second sense amplification enable signal LSAE2.

The above-mentioned two logic signals LSAE1 and LSAE2 are generated by a combination of the three logic circuits respectively shown in FIGS. 2, 3, and 4. As shown in FIG. 4, these two logic signals LSAE1 and LSAE2 are generated in response to an input logic signal LSAE which is generated by the logic circuit of FIG. 3 in response to an original sense amplification enable signal SAE and a data comparison signal DATACOMP, wherein the original sense amplification enable signal SAE is issued by the SDRAM device (not shown) when it is outputting the requested data to the sense/output circuit, and the data comparison signal DATACOMP is generated by the logic circuit of FIG. 2 in response to the paired complementary data signals (D0B, D0), (D1B, D1), . . . , (DnB, Dn) which represent the respective bits in each word of the requested data (note that in FIG. 1, only the complementary data signals (D0B, D0) are shown).

Referring first to FIG. 2, the logic circuit used to generate the data comparison signal DATACOMP includes a plurality of XOR gates 500, 501, . . . , 50n, and a NOR gate 52. The XOR gates 500, 501, . . . , 50n each have two input ends respectively connected to receive one pair of the complementary data signals DjB, Dj, for j=0, 1, . . . , or n. This number n is equal to the number of bits in each output word from the SDRAM device (not shown) during each read cycle. Each pair of complementary data signals, for example the data signals (D0B, D0) shown in FIG. 1, are respectively fetched from the output end of the first NAND gate 14 and the output end of the second NAND gate 16 shown in FIG. 1. The output signals from the XOR gate 500, 501, . . . , 50n are then transferred to the NOR gate 52 where an NOR logic operation is performed, and the output of the NOR gate 52 serves as the data comparison signal DATACOMP.

Referring next to FIG. 3, the logic circuit for generating the logic signal LSAE includes a PMOS transistor 60, a first NMOS transistor 62, a second NMOS transistor 64, a latch 74, a first inverter 66, a second inverter 68, a NAND gate 70, and a third inverter 72.

The PMOS transistor 60 is connected in such a manner that its source is connected to the system voltage VCC, its drain is connected to an output node N, and its gate is connected to receive a sense amplification enable signal SAE (hereinafter referred to as original sense amplification enable signal) which is generated by the SDRAM device (not shown) when it is ready to output the requested data. The first NMOS transistor 62 is connected in such a manner that its source is connected to the output node N, its drain is connected to the source of the second NMOS transistor 64, and its gate is connected to receive the data comparison signal DATACOMP from the logic circuit of FIG. 2. The second NMOS transistor 64 is connected in such a manner that its source is connected to the drain of the first NMOS transistor 62, its drain is connected to the ground GND, and its gate is connected to receive the original sense amplification enable signal SAE. Furthermore, the output node N is connected to the latch 74 so that the output voltage at the output node N can be latched therein. The latch 74 is composed of a pair of inverters 76, 78, which are interconnected in a back-to-back loop, and is used to latch the output voltage at the output node N. The output voltage at the output node N is further transferred successively via the first inverter 66 and the second inverter 68 to one input end of the NAND gate 70 whose other input end is connected to receive the original sense amplification enable signal SAE. The output of the NAND gate 70 is then inverted by the third inverter 72, and the output of the third inverter 72 is used to serve as the logic signal LSAE.

Referring further to FIG. 4, the logic signal LSAE generated by the logic circuit of FIG. 3 is then processed by a logic circuit composed of a first delay circuit 80, a first NOR gate 82, a first inverter 84, a second delay circuit 86, a second NOR gate 88, and a second inverter 90.

The first delay circuit 80 is composed of an even number of inverters. The input end of the first delay circuit 80 is connected to receive the logic signal LSAE. The first NOR gate 82 has a first input end connected to the receive the logic signal LSAE and a second input end connected to the output end of the first delay circuit 80 to receive a delayed version of the logic signal LSAE. The delay time is dependent on the number of inverters in the first delay circuit 80. The output of the first NOR gate 82 is inverted by the first inverter 84 whose output is then used both to serve as the sense amplification enable signal LSAE1 and to serve as the input signal to the second delay circuit 86. The second delay circuit 86 is also composed of an even number of inverters, and is used to cause a delay to the output signal from the first inverter 84. The second NOR gate 88 has a first input end connected to receive the logic signal LSAE and a second input end connected to the output end of the second delay circuit 86. The output from the second NOR gate 88 is inverted by the second inverter 90 to obtain an output signal serving as the logic signal LSAE2.

Figure 5:
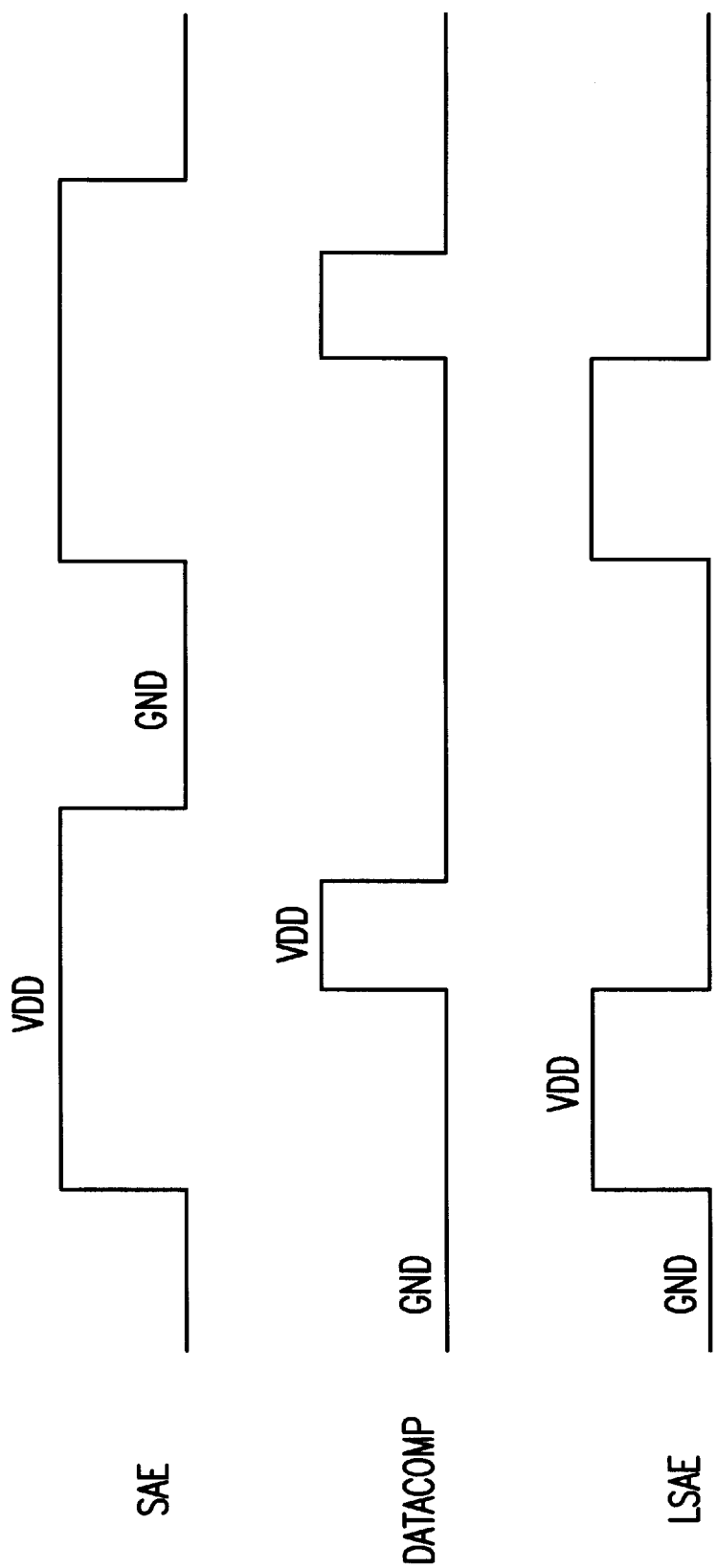
FIG. 5 is a waveform diagram showing the timings between SAE, DATACOMP, and LSAE logic signals.

FIG. 5 is a waveform diagram showing the timings between the logic signals SAE, DATACOMP, and LSAE shown in FIGS. 2, 3, and 4.

During each read cycle, when the SDRAM device (not shown) is ready to output the requested data, it first switches the original sense amplification enable signal SAE to a high-voltage logic state. In response to this, the logic circuit of FIG. 3 pulls up the logic signal LSAE to the high-voltage logic state. In response to this, the logic circuit of FIG. 4 switches both LSAE1 and LSAE2 to the high-voltage logic state. This causes both the first-stage amplification circuit 10 and the second-stage amplification circuit 12 to be switched ON, both the first and second transmission gates 18, 20 to be switched ON, and both the PMOS transistors 37, 38 to be switched OFF. As a result, the differential data signal representative of the requested data on the BL and BLB bit lines are amplified by the first-stage amplification circuit 10 and subsequently by the second-stage amplification circuit 12 to obtain the amplified data signals D0B, D0 which are then outputted via the output buffer 24 to the external circuitry (not shown).

The data signals D0B, D0 are complementary to each other; i.e., either D0B is in a high-voltage logic state while D0 is a low-voltage logic state, or D0B is in a low-voltage logic state while D0 is a high-voltage logic state, which represent one of the two binary values of the requested data, 0 or 1. Both of these conditions will caused the logic circuit of FIG. 2 to switch the data comparison signal DATACOMP to a high-voltage logic state, which in turn causes the first NMOS transistor 62 used in the logic circuit of FIG. 3 to be switched ON, causing the logic signal LSAE to be switched to a low-voltage logic state. The condition of the logic signal LSAE being switched to a low-voltage logic state then causes the logic circuit of FIG. 4 to switch both the logic signals LSAE1 and LSAE2 to the low-voltage logic state, thereby disabling both the first and second transmission gates 18, 20 and both the first-stage amplification circuit 10 and the second-stage amplification circuit 12, thus allowing these circuit components to consume no electrical power during this time.

It can be learned from the foregoing description that the first-stage amplification circuit 10, the second-stage amplification circuit 12, the first transmission gate 18, and the second transmission gate 20 are all switched ON only during the requested data output, and are immediately switched OFF after the requested data output is completed. This feature allows these circuit components to consume no electrical power after the requested data output is completed.

In conclusion, the sense/output circuit of the invention has the following advantages over the prior art.

First, the sense/output circuit of the invention is capable of switching off some power-consuming circuit components immediately after the requested data output is completed, thus reducing power consumption.

Second, the reduction of power consumption can be achieved without concerning process parameters, component parameters, and temperature variations. As a result, the delay margin can be reduced compared to the prior art, which also contributes to the reduction of power consumption.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A sense/output circuit for a memory device, the memory device having a pair of complementary bit lines and being driven by a system voltage, the sense/output circuit comprising:

a sense amplifier coupled to the complementary bit lines for amplifying the differential data signal representative of data on the complementary bit lines, the amplified signal being transferred to a pair of complementary data lines;

an equalizing transistor connected across the data lines for equalizing the data lines into an equalized voltage state;

a first PMOS transistor whose source is connected to the system voltage, whose drain is connected to a first complementary data line, and whose gate is connected to a first sense amplification enable signal, such that during a waiting state of each read cycle, the first PMOS transistor is switched on by the first sense amplification enable signal to pull the first complementary data line to a high-voltage logic state;

a second PMOS transistor whose source is connected to the system voltage, whose drain is connected to a second complementary data line, and whose gate is connected to the first sense amplification enable signal, such that during waiting state of each read cycle, the second PMOS transistor is switched on by the first sense amplification enable signal to pull the second complementary data line to a high-voltage logic state;

a first NAND gate having a first input end connected to the first complementary data line and a second input end connected to a second sense amplification enable signal;

a second NAND gate having a first input end connected to the second complementary data line and a second input end connected to the second sense amplification enable signal;

an inverter whose input end is connected to receive the second sense amplification enable signal;

a first transmission gate whose input end is connected to the output end of the first NAND gate, and whose ON/OFF state is controlled by the second sense amplification enable signal;

a second transmission gate whose input end is connected to the output end of the second NAND gate, and whose ON/OFF state is controlled by the second sense amplification enable signal; and an output buffer, coupled to the output end of the first transmission gate and the output end of the second transmission gate, for buffering the output signals from the first and second transmission gates;

wherein during each read cycle, the first and second sense amplification enable signals are both pulled up to a high-voltage logic state to switch on the sense amplifier and both the first and second transmission gates, and subsequently, when the respective data signals on the complementary data lines are complementary to each other, the second sense amplification enable signal and the first sense amplification enable signal are successively switched to a low-voltage logic state, thereby switching off the sense amplifier and the first and second transmission gates.

2. The sense/output circuit of claim 1, further comprising a first logic circuit for generating a data comparison signal, the first logic circuit including:

an XOR gate having a first input end connected to the output end of the first NAND gate and a second input end connected to the output end of the second NAND gate; and a NOR gate having an input end connected to the output end of the XOR gate and whose output severs as the intended data comparison signal.

3. The sense/output circuit of claim 2, further comprising:

a second logic circuit for generating an LSAE signal in response to the data comparison signal and an original sense amplification enable signal which is generated when the requested data is being outputted; the second logic circuit including:

a PMOS transistor whose source is connected to the system voltage, whose drain is connected to an output node, and whose gate is connected to receive the original sense amplification enable signal;

a first NMOS transistor whose source is connected to the drain of the PMOS transistor, and whose gate is connected to receive the data comparison signal;

a second NMOS transistor whose source is connected to the drain of the first NMOS transistor, whose drain is connected to the ground, and whose gate is connected to receive the original sense amplification enable signal;

a first inverter whose input end is connected to the output node connected to the drain of the PMOS transistor and the source of the first NMOS transistor;

a second inverter whose input end is connected to the output end of the first inverter;

a NAND gate having a first input end connected to receive the sense amplification enable signal and a second input end connected to the output end of the second inverter; and a third inverter whose input end is connected to the output end of the NAND gate and whose output servers as the intended LSAE signal.

4. The sense/output circuit of claim 3, wherein the sense amplification enable signal generating circuit further includes a latch connected to the output node connected to the drain of the PMOS transistor and the source of the first NMOS transistor.

5. The sense/output circuit of claim 3, further comprising:

a third logic circuit for generating the first and second sense amplification enable signals, the third logic circuit including:

a first delay circuit whose input end is connected to receive the logic signal LSAE for providing a predefined delay to the logic signal LSAE;

a first NOR gate having a first input end connected to receive the logic signal LSAE and a second input end connected to the output end of the first delay circuit;

a first inverter whose input end is connected to the output end of the first NOR gate and whose output serves as the second sense amplification enable signal;

a second delay circuit whose input end is connected to the output end of the first inverter to provide a second predefined delay to the output of the first inverter;

a second NOR gate having a first input end connected to receive the logic signal LSAE and a second input end connected to the output end of the second delay circuit; and a second inverter whose input end is connected to the output end of the second NOR gate and whose output serves as the first sense amplification enable signal.

6. The sense/output circuit of claim 5, wherein the first and second delay circuits are each composed of an even number of inverters.

7. The sense/output circuit of claim 1, further comprising:

a first latch coupled between the output end of the first transmission gate and the output buffer; and a second latch coupled between the output end of the second transmission gate and the output buffer.

8. The sense/output circuit of claim 7, wherein the first latch includes:

a first inverter whose input end is connected to the input end of the first latch, and whose output end is connected to the output end of the first latch; and a second inverter whose input end is connected to the output end of the first inverter, and whose output end is connected to the input end of the first inverter.

9. The sense/output circuit of claim 7, wherein the second latch includes:

a first inverter whose input end is connected to the input end of the second latch, and whose output end is connected to the output end of the second latch; and a second inverter whose input end is connected to the output end of the first inverter, and whose output end is connected to the input end of the first inverter.

10. The sense/output circuit of claim 1, wherein the first transmission gate includes:
   a PMOS transistor whose source is connected to the input end of the first transmission gate, whose drain is connected to the output end of the first transmission gate, and whose gate is connected to receive the inverted version of the second sense amplification enable signal; and
   a NMOS transistor whose source is connected to the input end of the first transmission gate, whose drain is connected to the output end of the first transmission gate, and whose gate is connected to receive the second sense amplification enable signal.

11. The sense/output circuit of claim 1, wherein the second transmission gate includes:
   a PMOS transistor whose source is connected to the input end of the second transmission gate, whose drain is connected to the output end of the second transmission gate, and whose gate is connected to receive the inverted version of the second sense amplification enable signal; and
   a NMOS transistor whose source is connected to the input end of the second transmission gate, whose drain is connected to the output end of the second transmission gate, and whose gate is connected to receive the second sense amplification enable signal.

12. The sense/output circuit of claim 1, wherein the memory device is an SDRAM device.

* * * * *